United States Patent
Chen et al.

(10) Patent No.: US 6,884,525 B2
(45) Date of Patent: Apr. 26, 2005

(54) RED LIGHT EMITTING MATERIALS

(75) Inventors: Chin-Ti Chen, Taipei (TW); Hsiu-Chih Yeh, Sanchung (TW); Wei-Ching Wu, Taipei County (TW); Li-Hsin Chan, Yangmei (TW)

(73) Assignee: Academia Sinica, Taipei (TW)

( * ) Notice: Subject to any disclaimer, the term of this patent is extended or adjusted under 35 U.S.C. 154(b) by 0 days.

(21) Appl. No.: 10/191,145

(22) Filed: Jul. 9, 2002

(65) Prior Publication Data

US 2004/0013902 A1 Jan. 22, 2004

(51) Int. Cl.$^7$ .............................................. H05B 33/14
(52) U.S. Cl. ...................... 428/690; 428/917; 313/504; 313/506; 252/301.16; 548/517; 548/548; 549/477
(58) Field of Search ................ 428/690, 917; 313/506, 504; 546/36, 256; 252/301.16; 548/517, 548; 549/477

(56) References Cited

U.S. PATENT DOCUMENTS

| | | | |
|---|---|---|---|
| 4,596,867 A | * 6/1986 | Fields et al. | 534/799 |
| 4,985,568 A | * 1/1991 | Lubowitz et al. | 548/431 |
| 5,409,783 A | 4/1995 | Tang et al. | 428/690 |
| 5,908,581 A | 6/1999 | Chen et al. | 252/301.16 |
| 5,935,720 A | 8/1999 | Chen et al. | 428/690 |
| 6,048,630 A | 4/2000 | Burrows et al. | 428/690 |
| 6,258,954 B1 | * 7/2001 | Kunimoto et al. | 546/36 |
| 6,333,122 B1 | 12/2001 | Furukawa et al. | 428/690 |
| 6,362,310 B1 | * 3/2002 | Woo et al. | 528/397 |

OTHER PUBLICATIONS

Picciolo et al., "Organic light–emitting devices with saturated red emission using 6,13–diphenylpentacene," Applied Physics Letters 78 (16):2378–2380, Apr. 16, 2001.

Tao et al., "Effective organic red electroluminescent device with narrow emission peak," Applied Physics Letters 78 (3):279–281, Jan. 15, 2001.

Zhang et al., "A new family of red dopants based on chromene–containing compounds for organic electroluminescent devices," Chem. Mater. 13:1565–1569, 2001.

* cited by examiner

*Primary Examiner*—Dawn Garrett
*Assistant Examiner*—Camie S Thompson
(74) *Attorney, Agent, or Firm*—Fish & Richardson, P.C.

(57) ABSTRACT

This invention features a compound having the formula:

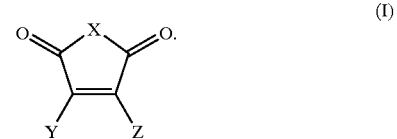

(I)

X is O or $NR_1$; and each of Y and Z, independently, is

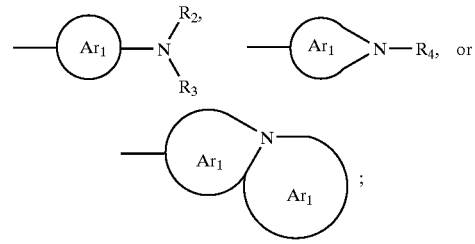

in which each of $R_1$, $R_2$, $R_3$, and $R_4$, independently, is alkyl, cyclyl, heterocyclyl, aralkyl, aryl, or heteroaryl; $Ar_1$ is aralkyl, aryl, or heteroaryl; and $Ar_2$ is cyclyl, heterocyclyl, aralkyl, aryl, or heteroaryl; or $Ar_1$ and $Ar_2$ taken together is heterocyclyl, aralkyl, or heteroaryl. This compound can be used as a red light emitting material in an electroluminescence device.

46 Claims, No Drawings

RED LIGHT EMITTING MATERIALS

BACKGROUND

Organic light emitting diodes (OLEDs) are useful in a wide range of lighting applications, as well as high and low resolution display devices. They have been made both with low molecular-weight organic materials and with polymers. For full-color applications, it is necessary to have a set of red, green, and blue OLEDs. Efficient green and blue OLEDs are now available. Yet, there has been a lack of red OLEDs that exhibit both saturated emissions and high, stable luminescence quantum efficiency (Picciolo et al. (2001) *Applied Phy. Lett.* 78: 2378).

Currently, most red OLEDs contain dopant-containing layers made of red light emitting materials. See, e.g., Chen et al. (1997) *Macromol. Symp.* 125: 1; and Zhang et al. (2001) *Chem. Mater.* 13: 1565; and Picciolo et al. (2001) *Appl. Phys. Lett.* 78: 2378. The red light emitting materials can be polar, such as electron donor-substituted pyran compounds (Tang et al. (1989) *Appl. Phys. Lett.* 65: 3610; Zhang et al. (2001) *Chem. Mater.* 13: 1565; and Chen et al. (2001) *J. Phys. D: Appl. Phys.* 34: 30). They can also be extensively π-conjugated, such as porphyrin compounds (Burrows et al. (1996) *Appl. Phys. Lett.* 69: 2959; Morgado et al. (2001) *J. Mater. Chem.* 11: 278; and Kwong et al. (2000) *Adv. Mater.* 12: 1134). These materials have a tendency towards crystallization, and thus, are either weakly emissive or not emissive in solid state. Further, dopant-containing OLEDs are not favored in mass production.

SUMMARY

This invention relates to compounds that are useful, among others, as red light emitting materials for red OLEDs.

In one aspect, this invention features a compound having the formula:

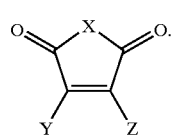

(I)

X is O or $NR_1$; and each of Y and Z, independently, is

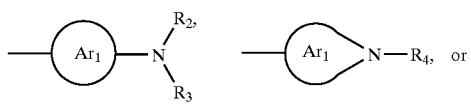

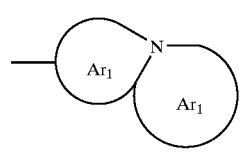

(referred to as $Ar_1NR_2R_3$; $Ar_1NR_4$; or $Ar_1Ar_2N$ hereinafter); in which each of $R_1$, $R_2$, $R_3$, and $R_4$, independently, is alkyl, cyclyl, heterocyclyl, aralkyl, aryl, or heteroaryl; $Ar_1$ is aralkyl, aryl, or heteroaryl; and $Ar_2$ is cyclyl, heterocyclyl, aralkyl, aryl, or heteroaryl; or $Ar_1$ and $Ar_2$ taken together is heterocyclyl, aralkyl, or heteroaryl.

A subset of the above-described compounds are those in which X is $NR_1$. Embodiments include compounds in which Y and Z, independently, is $Ar_1NR_2R_3$. Examples of $Ar_1$ include, but are not limited to, phenyl, furyl, thienyl, fluorenyl, 9,9'-R,R-substituted fluorenyl [each of the Rs, independently, is aryl (e.g., phenyl or 4-tolyl), or $C_1$~$C_6$ alkyl], and [9,9']spirobifluorenyl. Representative compounds are:

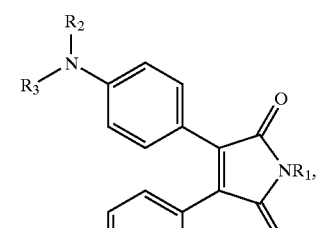

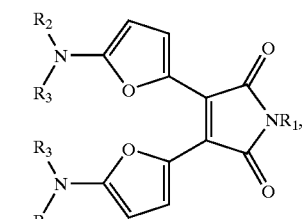

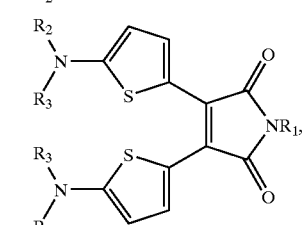

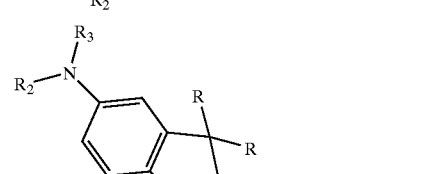

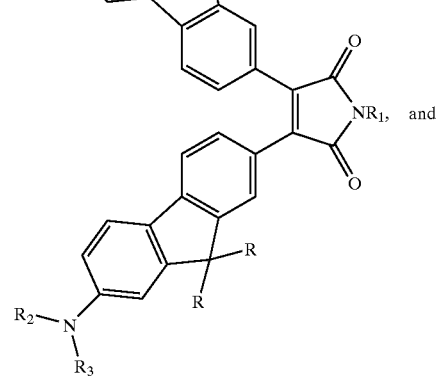

and

-continued

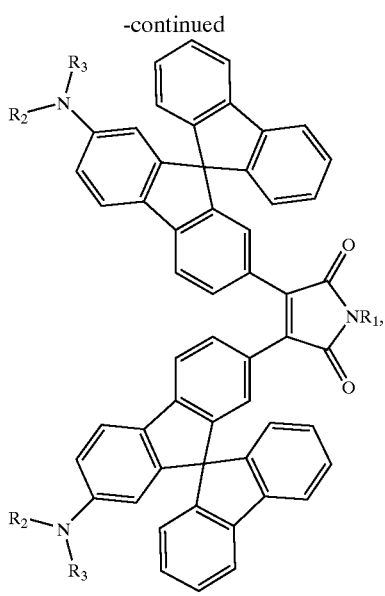

In each of the above structures, the two $R_2$'s (or the two $R_3$'s) can be the same or different. The same rule applies to other similar situations. Each of $R_2$ and $R_3$, independently, can be phenyl or naphthyl; and $R_1$ can be $CH_3$. Additional examples of $R_2$ and $R_3$ include, but are not limited to, biphenyl, terphenyl, anthracenyl, acenaphyl, perylenyl, pyrenyl, petacenyl, [9,9']spirobifluorenyl, 9,9'-diarylfluorenyl, 9,9'-dialkylfluorenyl, and 9,9'-alkylarylfluorenyl; in which aryl represents phenyl, naphthyl, anthracenyl, pyrenyl, petacenyl, tolyl, or anisolyl, and alkyl represents methyl, ethyl, propyl, or butyl.

In other embodiments, each of Y and Z, independently, is $Ar_1NR_4$. $Ar_1$ can be carbazolyl or indolyl. Representative compounds are:

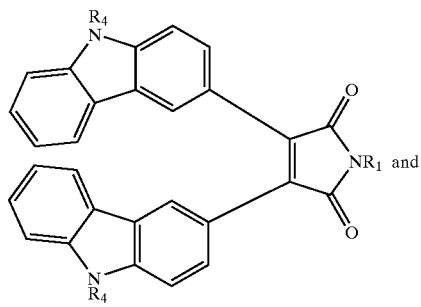

and

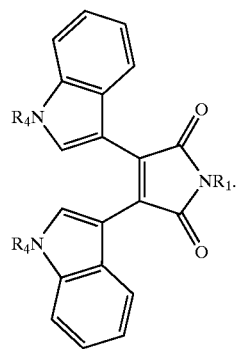

In still other embodiments, each of Y and Z, independently, is $Ar_1Ar_2N$. $Ar_1$ and $Ar_2$ taken together can be pyrido-quinoline. A representative compound is:

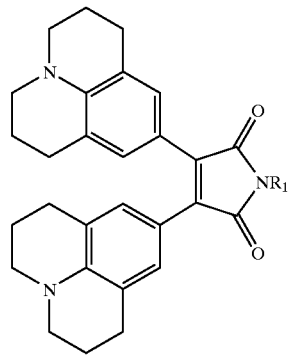

Another set of the compounds of this invention are those in which X is O. In these compounds, each of Y and Z, independently, can be $Ar_1NR_2R_3$ and $Ar_1$ can be phenyl, furyl, thienyl, fluorenyl, 9,9'-R,R-substituted fluorenyl [each of the Rs, independenly, is aryl (e.g., phenyl or 4-tolyl), or $C_1$~$C_6$ alkyl], or [9,9']spirobifluorenyl. Each of Y and Z, independently, also can be $Ar_1NR_4$ or $Ar_1Ar_2N$, and $Ar_1$ can be carbazolyl or indolyl, or $Ar_1$ and $Ar_2$ taken together can be pyrido-quinoline. Representative compounds are:

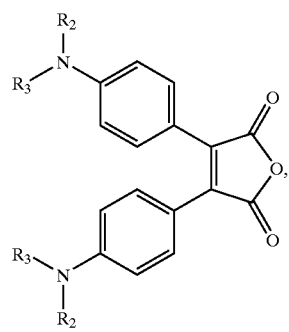

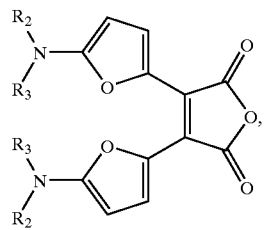

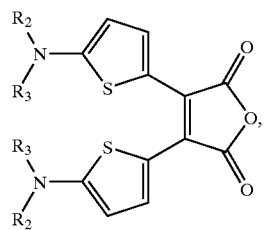

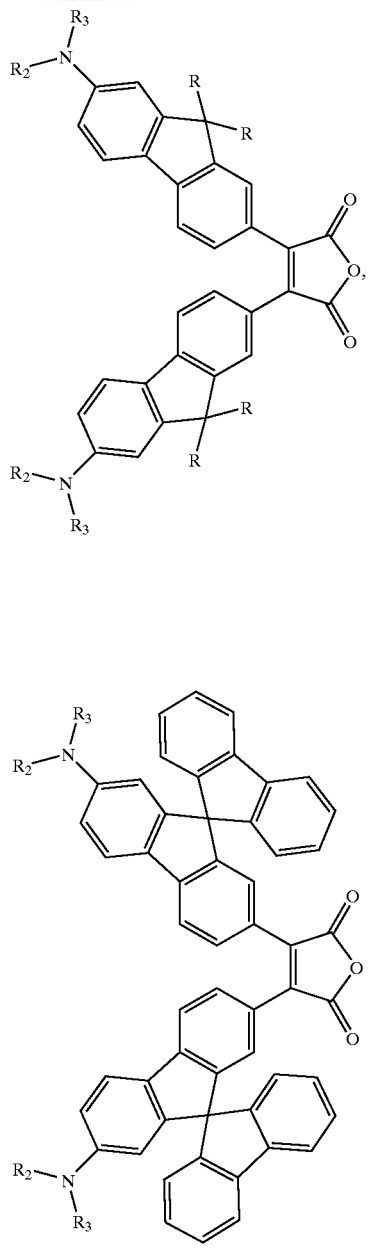

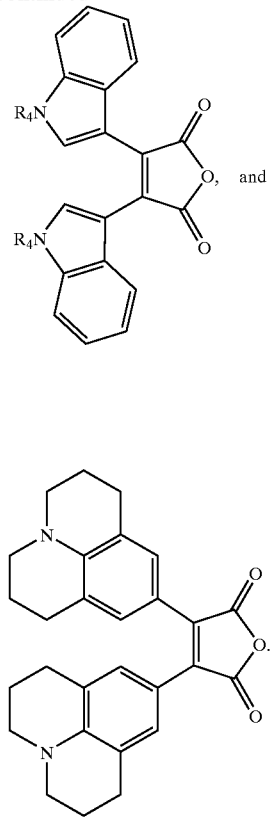

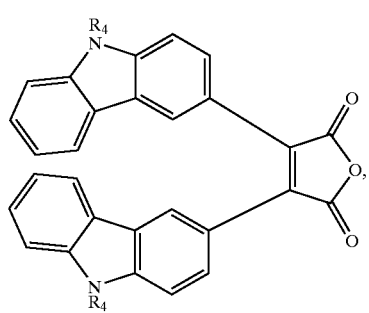

Alkyl, cyclyl, heterocyclyl, aralkyl (e.g., fluorenyl or carbazolyl), aryl (e.g., phenyl), or heteroaryl (e.g., furyl, thienyl, or indolyl) mentioned above refers to both substituted and unsubstituted moieties. The term "substituted," in turn, refers to one or more substituents (which may be the same or different), each replacing a hydrogen atom. Examples of substituents include, but are not limited to, halogen, amino, alkylamino, arylamino, dialkylamino, diarylamino, hydroxyl, mercapto, sulfonyl, cyano, nitro, $C_1$~$C_3$, alkyl, $C_1$~$C_6$ alkenyl, $C_1$~$C_6$ alkoxy, aryl, heteroaryl, aryloxy, cyclyl, or heterocyclyl; wherein alkyl, alkenyl, alkoxy, aryl, and heteroaryl are optionally substituted with $C_1$~$C_6$ alkyl, halogen, amino, alkylamino, arylamino, dialkylamino, diarylamino, hydroxyl, mercapto, cyano, or nitro.

The term "aralkyl" refers to a moiety in which an alkyl hydrogen atom is replaced by an aryl group. Examples of aralkyl moieties include fluorenyl, carbazolyl, and 9,9'-substituted fluorenyl, such as [9,9']spirobifluorenyl, 9,9'-diarylfluorenyl, 9,9'-dialkylfluorenyl, and 9,9'-alkylarylfluorenyl; in which aryl represents phenyl, naphthyl, anthracenyl, pyrenyl, petacenyl, tolyl, or anisolyl, and alkyl represents methyl, ethyl, propyl, or butyl.

The term "aryl" refers to a hydrocarbon ring system having at least one aromatic ring. Examples of aryl moieties include, but are not limited to, phenyl, naphthyl, anthracenyl, perylenyl, and pyrenyl.

The term "heteroaryl" refers to a hydrocarbon ring system having at least one aromatic ring which contains at least one heteroatom such as O, N, or S. Examples of heteroaryl moieties include, but are not limited to, pyridinyl, carbazolyl, and indolyl.

The terms "cyclyl" and "heterocyclyl" refer to partially and fully saturated mono-, bi-, or tri-cyclic rings having from 4 to 14 ring atoms. A heterocyclyl ring contains one or more heteroatoms. Exemplary cyclyl and heterocyclyl rings are cycylohexane, piperidine, piperazine, morpholine, thiomorpholine, and 1,4-oxazepane.

The compounds described above include the compounds themselves, as well as their salts, if applicable. The salts, for example, can be formed via interactions between a positively charged substituent (e.g., amino) on a compound and an anion. Suitable anions include, but are not limited to, chloride, bromide, iodide, sulfate, nitrate, phosphate, citrate, methanesulfonate, trifluoroacetate, and acetate. Likewise, a negatively charged substituent (e.g., carboxylate) on a compound can form a salt with a cation. Suitable cations include, but are not limited to, sodium ion, potassium ion, magnesium ion, and ammonium cation such as tetramethylammonium ion. In addition, some of the compounds have one or more asymmetric centers. Such compounds can occur as racemates, tautomers, enantiomers, and diastereometers.

One exemplary compound of this invention is N-methyl-bis(4-(1-naphthylphenylamino)phenyl)maleimide:

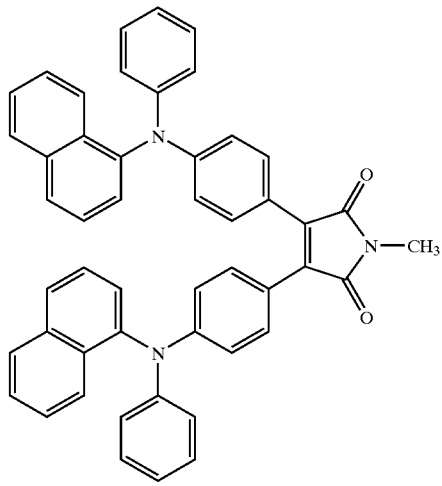

In another aspect, this invention features a red light emitting electro-luminescence device that is made with one or more of the compounds described above. The device includes an anode layer, a hole transporting layer, a light emitting layer that includes the compounds of this invention, an electron transporting layer, and a cathode layer. The anode, the hole transporting layer, the light emitting layer, the electron transporting layer, and the cathode are disposed in the above order. The hole transporting layer and the light emitting layer can be of the same layer. In other words, a layer, that sandwiches between the anode layer and the electron transporting layer, functions as both a hole transporting layer and a light emitting layer.

Other features, objects, and advantages of the invention will be apparent from the description and from the claims.

DETAILED DESCRIPTION

Within the scope of this invention are novel compounds and red light emitting electro-luminescence devices that contain such compounds.

The compounds of this invention can be prepared by methods well known to a skilled person in the art. For example, shown below is a scheme that depicts a synthetic route. In this scheme, $Ar_1$, $R_1$, $R_2$, and $R_3$ are as defined in Summary.

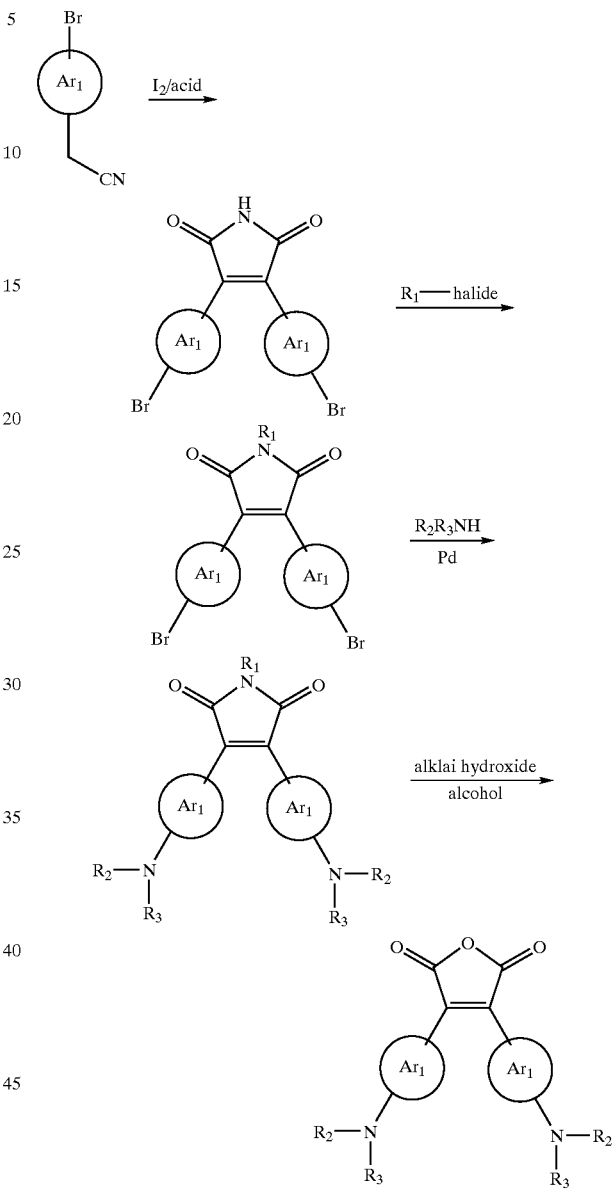

As shown in the above scheme, a compound of this invention can be prepared with a cyanomethyl-bromoaryl compound as a starting material. More specifically, a cyanomethyl-bromoaryl compound is oxidized with iodine and hydrolyzed with an acid, followed by alkylation with a $R_1$-halide and reaction with a $R_2$, $R_3$-substituted amine in the presence of palladium to form a desired product. If an asymmetrical compound of this invention is desired, two different cyanomethyl-bromoaryl compounds or two different $R_2$, $R_3$-substituted amines can be used.

In another example, as shown below, a cyanomethyl-substituted compound can be oxidized with an oxidizing agent, hydrolyzed with an acid, and alkylated with a $R_1$-halide to form another compound of this invention. Further hydrolysis in alkali alchoholic solution can generate anhydride derivatives. In this scheme, $Ar_1$, $Ar_2$, and $R_1$ are as defined in Summary.

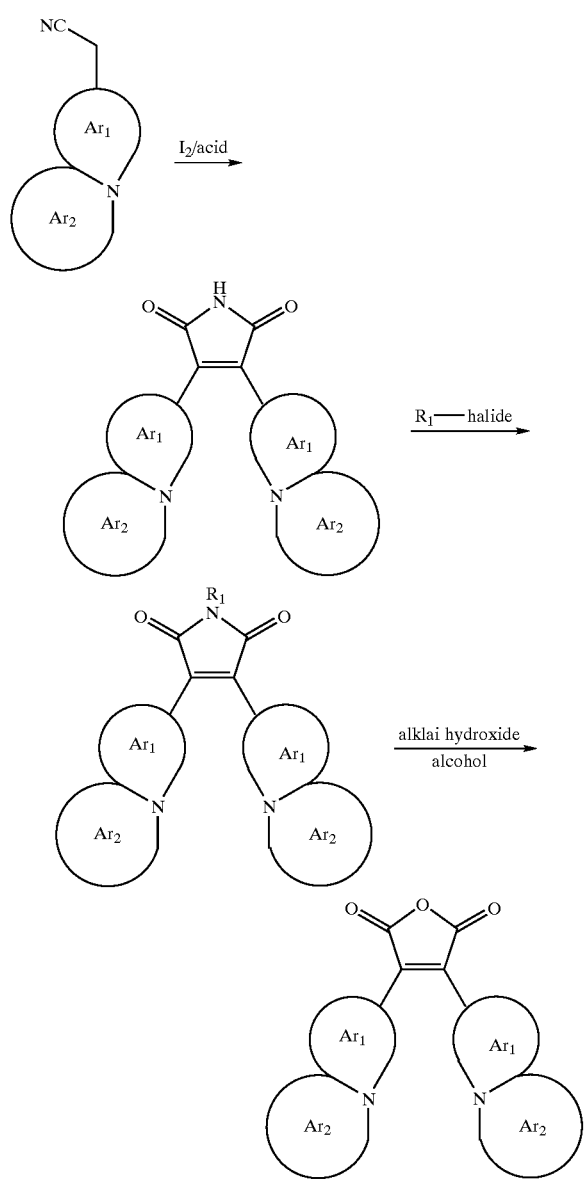

The chemicals used in the above-described synthetic routes may include, for example, solvents, reagents, catalysts, protecting group and deprotecting group reagents. The methods described above may also additionally include steps, either before or after the steps described specifically herein, to add or remove suitable protecting groups in order to ultimately allow synthesis of the compound of this invention. In addition, various synthetic steps may be performed in an alternate sequence or order to give a desired compound. Synthetic chemistry transformations and protecting group methodologies (protection and deprotection) useful in synthesizing applicable the claimed compounds are known in the art and include, for example, those described in R. Larock, *Comprehensive Organic Transformations*, VCH Publishers (1989); T. W. Greene and P. G. M. Wuts, *Protective Groups in Organic Synthesis*, 2d. Ed., John Wiley and Sons (1991); L. Fieser and M. Fieser, *Fieser and Fieser's Reagents for Organic Synthesis*, John Wiley and Sons (1994); and L. Paquette, ed., *Encyclopedia of Reagents for Organic Synthesis*, John Wiley and Sons (1995) and subsequent editions thereof.

A compound of this invention thus synthesized can be further purified by a method such as column chromatography, high pressure liquid chromatography, recrystallization, or sublimation.

One or more compounds of the invention can be used as a red light emitting material in an electro-luminescence device.

Typically, an electro-luminescence device is either a two- or a three-layer structured device. A two-layer structured device can include a hole transporting layer and an electron transporting layer, sandwiched between two layers of electrodes. Either the hole transporting layer or the electron transporting layer can function as a luminescent layer, which emits lights (Tang et al., (1989) *J. Appl. Phys.* 65: 3610). Generally, an anode layer, a hole transporting layer, an electron transport layer, and a cathode layer are deposited sequentially in the above order. The anode layer can be formed on a substrate, such as a glass. A three-layer structured device can include a hole transporting layer, a luminescent layer (i.e., light emitting layer), and an electron transporting layer, sandwiched between two layers of electrodes. More specifically, an anode layer, a hole transporting layer, a luminescent layer, an electron transport layer, and a cathode layer are deposited sequentially in the above order. The luminescent layer can be another hole transporting, another electron transporting layer, or a hole blocking layer. Optionally, the electro-luminescence device can include a dopant-containing layer, which can be an electron transporting layer or a luminescent layer.

Each of the above mentioned layers can be made of various materials, as described in, for example, U.S. Pat. No. 5,698,740. More specifically, a substrate can be made of glass; an anode layer can be a film of a transparent electroconductive material, e.g., indium tin oxide (ITO); a hole transporting layer can be made of 4,4'-bis[N-(1-naphthyl)-N-phenyl-amino]-biphenyl; an optional hole blocking layer can be made of 2,9-dimethyl-4,7-diphenyl-1,10-phenanthroline (BCP); an electron transporting layer can be made of 1,3,5-tris(N-phenylbenzimidazol-2-yl)benzene (TPBI); and a cathode layer can be made of a metal film, e.g., an alloy of magnesium and silver.

The fabrication of an electro-luminescence device has been described in, for example, Tang & VanSlyke (1987) *Appl. Phys. Lett.* 51: 913; Tang et al., (1989) *J. Appl. Phys.* 65: 3610, or Kido & Lizumi (1997) *Chem. Lett.* 963. More specifically, each layer may be formed by any film forming method such as vacuum deposition. See U.S. Pat. No. 5,698,740.

This invention features a device containing a light emitting layer that is made of one of the novel compounds described above. As an example, the device includes an anode layer, a hole transporting/light emitting layer that includes the compounds of this invention; an electron transporting layer; and a cathode layer. The anode, the hole transporting/light emitting layer, the electron transporting layer, and the cathode are disposed in the above order. Unexpectedly, this device is capable of emitting red light efficiently.

The specific example below is to be construed as merely illustrative, and not limitative of the remainder of the disclosure in any way whatsoever. Without further elaboration, it is believed that one skilled in the art can, based on the description herein, utilize the present invention to its fullest extent. All publications, including patents, cited herein are hereby incorporated by reference in their entirety. Synthesis and Characterization of N-methyl-bis(4-(1-naphthylphenylamino)phenyl)maleimide (NPAMLI)

NPAMLI was prepared as follows:

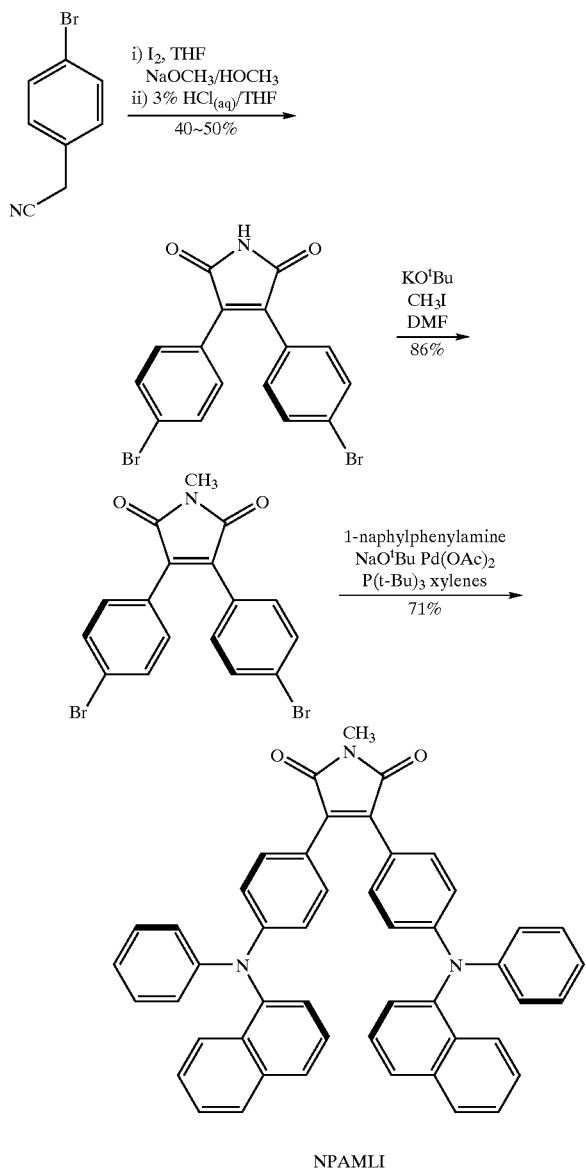

NPAMLI

More specifically, 4-bromobenzyl cyanide was oxidized with iodine and hydrolyzed with 3% HCl (aq)/THF to form bis(4-bromophenyl)maleonitrile (40~50%). See Cook & Linstead (1937) *J. Chem. Soc.* 929. Bis(4-bromophenyl)maleonitrile thus obtained was alkylated with KotBu/CH$_3$I to afford N-methyl-bis(4-bromophenyl)maleimide (86%). NPAMLI was prepared by palladium catalyzed amination of N-methyl-bis(4-bromophenyl)maleimide (71%), followed by column chromatography and sublimation purification. The synthetic data of the synthesized compounds are listed below:

Bis(4-bromophenyl)maleimide: $^1$H NMR (400 MHz, CDCl$_3$): δ [ppm]. 7.51 (d, 4H, J=8.7 Hz), 7.49 (s, 1H), 7.33 (d, 4H, J=8.7 Hz). $^{13}$C{$^1$H} NMR (100 MHz, CDCl$_3$): δ [ppm] 169.4, 136.0, 132.2, 131.3, 126.9, 125.1. FAB-MS: calcd MW, 407.06, m/e=408 (M$^+$+1).

N-Methyl-bis(4-bromophenyl)maleimide: $^1$H NMR (400 MHz, CDCl$_3$): δ [ppm] 7.50 (d, 4H, J=8.6 Hz), 7.33 (d, 4H, J=8.6 Hz), 3.13 (s, 3H). $^{13}$C{$^1$H} NMR (100 MHz, CDCl$_3$): δ [ppm] 170.2, 135.5, 132.1, 131.3, 127.2, 124.8, 24.4. FAB-MS: calcd MW, 421.08, m/e=422 (M$^+$+1).

N-Methyl-bis(4-(1-naphthylphenylamino)phenyl)maleimide (NPAMLI): Data of optical, electrochemical, and thermal properties of NPAMLI are summarized in Table 1. $^1$H NMR (400 MHz, CDCl$_3$): δ [ppm] 7.91 (d, 2H, J=8.2 Hz), 7.83 (d, 2H, J=8.3 Hz), 7.78 (d, 2H, J=8.5 Hz), 7.52 (t, 2H, J=11.9 Hz), 7.36–7.42 (m, 4H), 7.20–7.25 (m, 6H), 6.94–7.06 (m, 10H), 6.54–6.59 (m, 4H), 3.09 (s, 3H) $^{13}$C{$^1$H} NMR (100 MHz, CDCl$_3$): δ [ppm] 171.9, 149.9, 147.0, 142.9, 136.1, 133.6, 131.7, 131.4, 129.8, 129.0, 128.1, 127.8, 126.9, 126.8, 124.4, 124.3, 124.0, 121.1, 118.7, 118.7, 24.4. FAB-MS: calcd MW, 697.27, m/e=697 (M$^+$). Anal. Found (calcd) for C$_{49}$H$_{35}$N$_3$O$_2$: C, 84.21 (84.34), H, 5.04 (5.06), N, 5.99 (6.02).

Optical, electrochemical, and thermal properties of NPAMLI were also determined. NPAMLI was dissolved in deoxygenated dry dichloromethane, containing 0.1 M tetrabutylammonium perchlorate as electrolyte and a platinum working electrode, as well as a saturated Ag/AgNO$_3$ reference electrode. Ferrocene was used for potential calibration (all reported potentials are references against ferrocene/ferrocenium, FOC) and (or reversibility criteria. Nile red ($\Phi_f$=0.68 in 1,4-dioxane) (Sarkar et al. (1994) *Langmuir* 10: 326 was used as the standard for the fluorescence quantum yield determination. Fluorescence and absorption spectra were recorded by fluorescence spectrophotometer (Hitachi F-450) and absorption spectrophotometer (Hewlett-Packard 8453), respectively. Glass transition temperature (T$_g$) and thermal decomposition temperature (T$_d$) of NPAMLI were determined by differential scanning calorimetry (DSC) and thermogravimetric analysis (TGA) using a Perkin-Elmer DSC-6 and TGA-7 analyzer systems, respectively. Both thermal analyses were performed with scanning (both heating and cooling) rate at 10 deg/min under nitrogen atmosphere. The temperatures were recorded on the intercept of the slope of thermogram changes (endothermic, exothermic, or weight loss) and the leading baseline as the estimation for on-set T$_g$ and T$_d$. Redox potentials of NPAMLI were determined by cyclic voltammetry (CV) using Electochemical Analyzer BAS 100B with scanning rate at 100 mV/s.

As shown in Table 1, NPAMLI has a fluorescence quantum yield ($\Phi_f$) of 21%, in 1,4-dioxane, which is almost two-folds of that of DCM (i.e., 11%), a commercially available laser dye and red dopant for red OLEDs (Tang et al. (1989) *Appl. Phys. Lett.* 65: 3610). Further, NPAMLI has a relatively wide full-width at half-maximum (fwhm~94 mn) of emission bands. Due to its long wavelength of emission, nearly half of emission bands (either of PL or EL spectra) locate outside the long wavelength limit of the human vision.

TABLE 1

Optical, electrochemical, and thermal properties of NPAMLI.

| $\Phi_f$ (%) | $\lambda_{max}^{abs}$ (nm)[a] | $\lambda_{max}^{em}$ Solution | (nm)[a] Solid film | E$^{red}$ | E$^{oxd}$ (V vs FOC) | T$_g$ (° C.) | T$_d$ (° C.) |
|---|---|---|---|---|---|---|---|
| 21 | 501 | 683 | 651 | −1.68 | +0.53 | 122 | 419 |

[a]Samples were dissolved in chloroform when spectra were recorded. Solid films were prepared by spin-casting from chloroform solution and then vacuum-dried.

Unexpectedly, NPAMLI showed an amorphous feature. More specifically, it is a fluorophore having a donor (two arylamines) and acceptor (imide), and does not tend to crystallization in solid state. DSC thermograms (>400° C.) of NPAMLI showed that a weak endothermic step-transition was around 120° C., indicating the glass phase transition, and no crystallization or melting was observed. The glass phase of NPAMLI was relatively stable since the endothermic step-transition was still observed even after the sample was repeated heating and cooling. With this amorphous feature, NPAMLI was able to be used as a nondoping red light emitting material with weak or no concentration quenching effect.

It was also unexpected that NPAMLI was electrochemically stable. Cyclic voltamograms showed NPAMLI's redox process involving one electroreduction and one electrooxidation, both of which were apparently reversible under CV conditions. After quantitation of redox signals on CV, it was concluded that the redox process involved one-electron reduction and two-electron oxidation per molecule of NPAMLI, which indicated that two arylamines are electronically independent and are electrooxidized simultaneously. With this feature, NPAMLI was able to be used as a hole transporting material in addition to a red light emitting material. Further, NPAMLI is thermally robust. Its $T_d$ is about 420° C. estimated by TGA.

Fabrication of a Device Including NPAMLI as a Red Light Emitting Material and a Hole-transporting Material A trilayer device ITO/NPAMLI/BCP/TPBI/Mg:Ag was fabricated by thermal deposition in a vacuum chamber (ULVAC Cryogenics at a chamber pressure of $10^{-6}$ Torr). The substrate was an ITO-coated glass with a sheer resistance of <50 Ω/sq. ITO cleaning included a routine chemical cleaning using detergent and alcohol in sequence, followed by oxygen plasma cleaning. Sequential evaporation of NPAMLI as a hole transporting layer (500 Å) as well as red light emitting layer, BCP as a hole blocking layer (100 Å), and TPBI as an electron transporting layer (400 Å) was performed. A cathode $Mg_{0.9}Ag_{0.1}$ alloy was then deposited (50 nm) by co-evaporation and followed by a thick silver capping layer.

The just-obtained device was tested for current density (I)-voltage (V)-luminance (L) characteristics, EL spectra of the device and PL spectra of NPAMLI, current density dependency of external quantum efficiency, and a CIE (Commission Internationale de l'Eclairage) 1931 color chromaticity diagram of the device. An EL spectrum with an emission maximum of 650 nm was observed, which was almost superimposable on a PL spectrum of NPAMLI. A weak but discernable emission band (around 380 nm) was also observed due to TPBI emission (Tao et al. (2000) *Appl. Phys. Lett.* 77: 933), even though a hole blocking layer of BCP was added to prevent the emission of TPBI. When the EL spectrum was converted into a chromaticity coordinates on a CIE 1931 diagram, an indication of red light emitting from the device was obtained (x=0.66, y=0.32), which was comparable with (x=0.64, y=0.33) of National Television System Committee (NTSC) standard red color. This device had the maximum luminance of near 8,000 cd/m$^2$ at 15 V; and luminance of more than 300 cd/m$^2$ at low current density of 20 mA/cm$^2$. It had the maximum external quantum efficiency of 2.4% (corresponding to 1.5 cd/A or 0.9 lm/W) at about 20 mA/cm$^2$. The performance of the device is comparable with or better than known red OLEDs, which all include a red dopant-containing layer. As the other red OLEDs, the device showed steady decline in efficiency with increasing current density and barely maintained at 1% of the external quantum efficiency at maximum luminance. See, e.g., Picciolo et al. (2000) *Appl. Phys. Lett.* 78: 2378; and Young et al. (2002) *Appl. Phys. Lett.* 80: 874. Unexpectedly, without using a dopant-containing layer, this device is able to emit red light efficiently, and is easily fabricated.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

From the above description, one skilled in the art can easily ascertain the essential characteristics of the present invention, and without departing from the spirit and scope thereof, can make various changes and modifications of the invention to adapt it to various usages and conditions. Accordingly, other embodiments are also within the scope of the following claims.

What is claimed is:

1. A compound of formula (I):

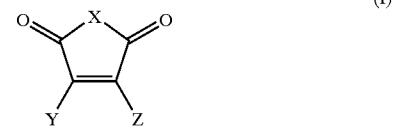

wherein

X is O or $NR_1$; and

Each of Y and Z, independently, is

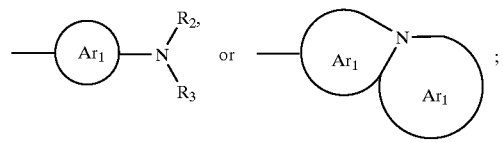

in which each of $R_1$, $R_2$, $R_3$, independently, is alkyl, cyclyl, heterocyclyl, aralkyl, aryl, or heteroaryl, where $R_2$ is different from $R_3$; $Ar_1$ is aralkyl, aryl or heteroaryl; $Ar_1$ and $Ar_2$ taken together is pyrido-quinolinyl.

2. The compound of claim 1, wherein X is $NR_1$.

3. The compound of claim 2, wherein each of Y and Z, independently, is

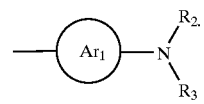

4. The compound of claim 3, wherein $Ar_1$ is phenyl.

5. The compound of claim 3, wherein $Ar_1$ is furyl.

6. The compound of claim 3, wherein $Ar_1$ is thienyl.

7. The compound of claim 3, wherein $Ar_1$ is fluorenyl.

8. The compound of claim 3, wherein $Ar_1$ is 9,9'-R,R-substituted fluorenyl, in which R is aryl or $C_1$~$C_6$ alkyl.

9. The compound of claim 3, wherein $Ar_1$ is [9,9'] spirobifluorenyl.

10. The compound of claim 4, wherein one of $R_2$ and $R_3$ is phenyl.

11. The compound of claim 10, wherein the other of $R_2$ and $R_3$ is naphthyl, and $R_1$ is $CH_3$.

12. The compound of claim 2, wherein each of Y and Z, independently, is

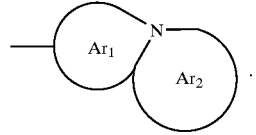

13. The compound of claim 1, wherein X is O.

14. The compound of claim 13, wherein each of Y and Z, independently, is

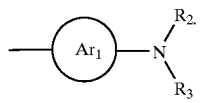

15. The compound of claim 14, wherein $Ar_1$ is phenyl.
16. The compound of claim 14, wherein $Ar_1$ is furyl.
17. The compound of claim 14, wherein $Ar_1$ is thienyl.
18. The compound of claim 14, wherein $Ar_1$ is fluorenyl.
19. The compound of claim 14, wherein $Ar_1$ is 9,9'-R,R-substituted fluorenyl, in which R is aryl or $C_1\sim C_6$ alkyl.
20. The compound of claim 14, wherein $Ar_1$ is [9,9'] spirobifluorenyl.
21. The compound of claim 15, wherein one of $R_2$ and $R_3$ is phenyl.
22. The compound of claim 21, wherein the other of $R_2$ and $R_3$ is naphthyl.
23. The compound of claim 13, wherein each of Y and Z, independently, is

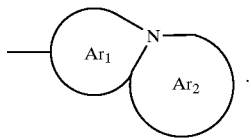

24. A red light emitting electro-luminescence device, comprising:
    an anode layer,
    a hole transporting layer,
    a light emitting layer,
    an electron transporting layer, and
    a cathode layer,
    wherein the anode layer, the hole transporting layer, the light emitting layer, the electron transporting layer, and the cathode layer are disposed in the above order; and the light emitting layer includes a compound of formula (I):

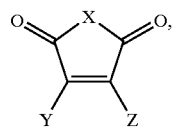

wherein
    X is O or $NR_1$; and
    Each of Y and Z, independently, is

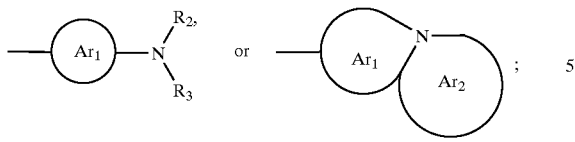

in which each of $R_1$, $R_2$, $R_3$, independently, is alkyl, cyclyl, heterocyclyl, aralkyl, aryl, or heteroaryl, where $R_2$ is different from $R_3$; $Ar_1$ is aralkyl, aryl or heteroaryl; $Ar_1$ and $Ar_2$ taken together is pyrido-quinolinyl.

25. The device of claim 24, wherein X is $NR_1$.
26. The device of claim 25, wherein each of Y and Z, independently, is

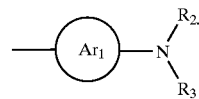

27. The device of claim 26, wherein $Ar_1$ is phenyl.
28. The device of claim 26, wherein $Ar_1$ is furyl.
29. The device of claim 26, wherein $Ar_1$ is thienyl.
30. The device of claim 26, wherein $Ar_1$ is fluorenyl.
31. The device of claim 26, wherein $Ar_1$ is 9,9'-R,R-substituted fluorenyl, in which R is aryl or $C_1\sim C_6$ alkyl.
32. The device of claim 26, wherein $Ar_1$ is [9,9'] spirobifluorenyl.
33. The device of claim 27, wherein one of $R_2$ and $R_3$ is phenyl.
34. The device of claim 33, wherein the other of $R_2$ and $R_3$ is naphthyl, and $R_1$ is $CH_3$.
35. The device of claim 25, wherein each of Y and Z, independently, is

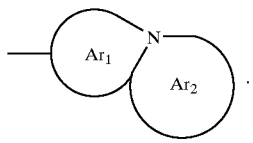

36. The device of claim 24, wherein X is O.
37. The device of claim 36, wherein each of Y and Z, independently, is

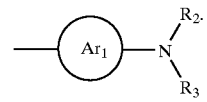

38. The device of claim 37, wherein $Ar_1$ is phenyl.
39. The device of claim 37, wherein $Ar_1$ is furyl.
40. The device of claim 37, wherein $Ar_1$ is thienyl.
41. The device of claim 37, wherein $Ar_1$ is fluorenyl.
42. The device of claim 37, wherein $Ar_1$ is 9,9'-R,R-substituted fluorenyl, in which R is aryl or $C_1\sim C_6$ alkyl.
43. The device claim 37, wherein $Ar_1$ is [9,9'] spirobifluorenyl.
44. The device of claim 38, wherein one of $R_2$ and $R_3$ is phenyl.
45. The device of claim 44, wherein the other of $R_2$ and $R_3$ is naphthyl.
46. The device of claim 36, wherein each of Y and Z, independently, is

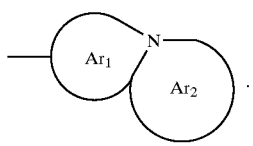

* * * * *